United States Patent
Huber et al.

(10) Patent No.: US 9,279,415 B1
(45) Date of Patent: Mar. 8, 2016

(54) SOLAR ARRAY INTEGRATION SYSTEM AND METHODS THEREFOR

(75) Inventors: Michael S. Huber, Livermore, CA (US); Michael E. Bowler, Woodbridge, CA (US)

(73) Assignee: SunLink Corporation, San Rafael, CA (US)

( * ) Notice: Subject to any disclaimer, the term of this patent is extended or adjusted under 35 U.S.C. 154(b) by 986 days.

(21) Appl. No.: 11/176,036

(22) Filed: Jul. 7, 2005

(51) Int. Cl.
| | |
|---|---|
| *H01L 31/042* | (2014.01) |
| *F03G 6/00* | (2006.01) |
| *H01L 31/052* | (2014.01) |
| *H01L 31/048* | (2014.01) |
| *H01L 31/024* | (2014.01) |

(52) U.S. Cl.
CPC .......... *F03G 6/001* (2013.01); *H01L 31/0521* (2013.01); *H01L 31/024* (2013.01); *H01L 31/042* (2013.01); *H01L 31/048* (2013.01); *Y02B 10/10* (2013.01); *Y02B 10/12* (2013.01); *Y02B 10/14* (2013.01); *Y02E 10/47* (2013.01); *Y02E 10/50* (2013.01); *Y02E 10/58* (2013.01)

(58) Field of Classification Search
CPC ......... Y02E 10/47; Y02E 10/50; H01L 31/04; H01L 31/042; H01L 31/048; H01L 31/0521; H01L 31/024; Y02B 10/20; Y02B 10/14; Y02B 80/50; F03G 6/001
USPC ......... 136/251, 244, 291, 259, 246; 52/173.3; 257/433; 248/200
See application file for complete search history.

(56) References Cited

U.S. PATENT DOCUMENTS

| | | | |
|---|---|---|---|
| 3,988,166 A | 10/1976 | Beam | |
| 4,204,523 A | 5/1980 | Rothe | |
| 4,226,256 A | 10/1980 | Hawley | |
| 4,269,173 A * | 5/1981 | Krueger et al. | 126/634 |

(Continued)

FOREIGN PATENT DOCUMENTS

| | | |
|---|---|---|
| DE | 2602814 | 8/1977 |
| DE | G7913751.2 | 5/1979 |

(Continued)

OTHER PUBLICATIONS

Imamura et al., "Photovoltaic System Technology" 1992 European Handbook, pp. 340-366.

(Continued)

*Primary Examiner* — Thanh-Truc Trinh
(74) *Attorney, Agent, or Firm* — Reed Smith LLP

(57) ABSTRACT

A solar array integration system (AIS) and methods for mounting solar energy capture devices are provided. Such systems are useful for applications such as mounting photovoltaic (PV) modules to a suitable surface such as a rooftop. In one embodiment, the AIS includes a first row of tilted solar modules, a center spoiler coupled to the first row of tilted solar modules, the center spoiler is configured to deflect frontal airflow over the first row of tilted solar modules, and a second row of tilted solar modules, the second row of tilted solar modules being coupled to each other by an aerodynamic spar. The aerodynamic spar includes a deflector configured to deflect frontal airflow over the second row of tilted solar modules. The deflector may include a wedge-shaped profile. AIS can also include a third row of tilted solar modules, with an end spoiler coupled to the third row of tilted solar modules, and wherein the end spoiler is configured to deflect side airflow over the third row of tilted solar modules.

15 Claims, 18 Drawing Sheets

(56) References Cited

U.S. PATENT DOCUMENTS

| | | | |
|---|---|---|---|
| 4,336,413 A | | 6/1982 | Tourneux |
| 4,371,139 A | * | 2/1983 | Clark ........................ 248/237 |
| 4,389,533 A | | 6/1983 | Ames |
| 4,476,853 A | | 10/1984 | Arbogast |
| 4,611,090 A | | 9/1986 | Catella et al. |
| 4,620,771 A | | 11/1986 | Dominguez |
| 4,636,577 A | | 1/1987 | Peterpaul |
| 4,649,675 A | | 3/1987 | Moldovan et al. |
| 4,674,244 A | | 6/1987 | Francovitch |
| 4,677,248 A | | 6/1987 | Lacey |
| 4,718,404 A | | 1/1988 | Sadler |
| 4,724,010 A | | 2/1988 | Okaniwa et al. |
| 4,886,554 A | | 12/1989 | Woodring et al. |
| 4,922,264 A | | 5/1990 | Fitzgerald et al. |
| 4,936,063 A | | 6/1990 | Humphrey |
| 5,112,408 A | | 5/1992 | Melchior et al. |
| 5,125,608 A | | 6/1992 | McMaster et al. |
| 5,142,293 A | | 8/1992 | Ross |
| 5,164,020 A | | 11/1992 | Wagner et al. |
| 5,228,924 A | | 7/1993 | Barker et al. |
| 5,338,369 A | | 8/1994 | Rawlings |
| 5,406,936 A | | 4/1995 | Hirai et al. |
| 5,409,549 A | | 4/1995 | Mori |
| 5,505,788 A | | 4/1996 | Dinwoodie |
| 5,524,401 A | | 6/1996 | Ishikawa et al. |
| 5,746,839 A | | 5/1998 | Dinwoodie |
| 6,046,399 A | * | 4/2000 | Kapner .......................... 136/244 |
| 6,063,996 A | | 5/2000 | Takada et al. |
| 6,495,750 B1 | | 12/2002 | Dinwoodie |
| 6,501,013 B1 | | 12/2002 | Dinwoodie |
| 6,570,084 B2 | | 5/2003 | Dinwoodie |
| 6,809,251 B2 | | 10/2004 | Dinwoodie |
| RE38,988 E | | 2/2006 | Dinwoodie |
| 2004/0045595 A1 | | 3/2004 | Makita et al. |
| 2004/0128923 A1 | | 7/2004 | Moulder et al. |
| 2004/0250491 A1 | | 12/2004 | Diaz et al. |

FOREIGN PATENT DOCUMENTS

| | | |
|---|---|---|
| DE | 2758067 | 7/1979 |
| DE | 2919901 | 11/1980 |
| DE | 3926967 | 2/1991 |
| DE | 3934485 | 4/1991 |
| DE | G9114555.4 | 2/1992 |
| DE | G9114556.2 | 2/1992 |
| DE | 4232367 | 5/1993 |
| DE | 29503315.0 | 2/1995 |
| DE | 29719513 U1 | 3/1998 |
| DE | 29804621 U1 | 9/1998 |
| DE | 19811399 A1 | 9/1999 |
| DE | 19823356 A1 | 11/1999 |
| DE | 20008509 U1 | 9/2000 |
| DE | 20011063 U1 | 10/2000 |
| DE | 29724278 U1 | 10/2000 |
| DE | 20200672 U1 | 1/2002 |
| DE | 20120983 U1 | 5/2002 |
| DE | 20200672 U1 | 7/2002 |
| DE | 20218424 U1 | 4/2003 |
| DE | 69815162 T2 | 12/2003 |
| DE | 69815168 T2 | 4/2004 |
| DE | 202005003750 U1 | 6/2005 |
| DE | 29610516 U1 | 9/2006 |
| DE | 60032292 T2 | 7/2007 |
| DE | 102006026297 B3 | 8/2007 |
| EP | 0282826 B1 | 12/1991 |
| EP | 0489791 B1 | 2/1993 |
| EP | 0436572 B1 | 11/1995 |
| EP | 0531869 B1 | 1/1997 |
| EP | 0857926 A1 | 8/1998 |
| EP | 1071136 | 1/2001 |
| EP | 1243717 A2 | 9/2002 |
| EP | 1243718 A2 | 9/2002 |
| EP | 1306907 A1 | 5/2003 |
| EP | 1376029 A2 | 1/2004 |
| EP | 0828034 A2 | 11/2005 |
| EP | 1788322 A1 | 5/2007 |
| EP | 1310747 B1 | 6/2007 |
| ES | 1061941 U | 1/2006 |
| ES | 1063823 | 10/2006 |
| ES | 1065162 | 6/2007 |
| WO | WO9003663 | 5/1990 |
| WO | WO94/00650 | 1/1994 |
| WO | WO9400650 | 6/1994 |
| WO | WO0216707 A1 | 2/2002 |
| WO | WO02/063219 A1 | 8/2002 |
| WO | WO02073703 | 9/2002 |
| WO | WO03038910 A2 | 5/2003 |
| WO | WO03083954 A2 | 9/2003 |
| WO | WO2004063485 A2 | 7/2004 |
| WO | WO2004066324 A2 | 8/2004 |
| WO | WO2005020290 A2 | 3/2005 |
| WO | WO2005059963 A1 | 6/2005 |
| WO | WO2006116398 A2 | 2/2006 |
| WO | WO2007135412 A1 | 11/2007 |
| WO | WO2008022179 A1 | 2/2008 |
| WO | WO2008022719 | 2/2008 |

OTHER PUBLICATIONS

Humm, et al., "Photovoltaik und Architektur Photovoltaics in Architecture" 1993, pp. 108-111.
Stefanakos, "Driving With the Sun: PV Electric Vehicle Recharging Station", 1993, pp. 15-16.
"Ejemplo 7, 15, 21: Electrificacion Explotacion Ganadera" pp. 149, 157, 163.
"Estructuras Soporte Para Paneles Fotovoltaicos" pp. 6/1-6/17.
Avances técnicos, Comercial Cointra, S. S. pp. 7, 96, 97, 98.
"Solar Energy in Architecture and Urban Planning" Third European conference on Architecture, May 1993, pp. 231-235 , 282-286.
Gillett, et al. "Photovoltaic Demonstration Projects", Commission of the European Communities, 1991 pp. 127-135, 190-197, 347-353.
Michael R. Starr "Photovoltaic Power for Europe", Solar Energy R&D in the European Community, Commission of the European Communities, 1983, pp. 31-37, 42-47.
Buresch, "Photovoltiac Energy Systems Design and Installation", McGraw-Hill Book Company, 1983, pp. 201-211.
Commission of the European Communities, "First E.C. Conference on Solar Collectors in Architecture, Integration of Photovoltiac and Thermal Collectors in New and Old building Structures" Proceedings of the International Conference held at Venice, Italy, Mar. 1983, pp. 20-28 and pp. 108-120.
Russell "An Apprentice's Guide to Photovoltaics" Solar Age, 1981 pp. 32-36.
"Phovoltiacs for Pumping Water" Solar Age, 1984 pp. 64.
Schaefer, "What We Know About Rooftop Electricity" Solar Age, 1984 pp. 19-26.
Weissman, "Photovoltaics for Utilities: Commercialization Through Collaboration" Solar Today pp. 31-33.
Soderberg, "Living Beyond the Top of the World" Solar Age, 1992, pp. 11-13.
Wolfe, "A Sunpowered Dream House" Solar Age, 1983, pp. 17-20.
"Today's Outstanding Photovoltaic Projects", Solar Age, Jun. 1985, pp. 40-45.
Vorwort, et al. "Photovoltaik und Architektur Photovoltaics in Architecture" 1993, pp. 108-111.
J. Chadjivassiliadis, et al. "Phovoltaic Demonstration Projects", Commission of the European Communities, 1991, pp. 127.
"Ilectrification Explotacion Ganadera", Comercial Cointra, S.A. pp. 149, 147, 163, 6-17.
Russell, et al. "PV Array Designs for Flat-Roof Buildings" IEEE, 1993 pp. 1129-1133.
Sick, et al. "Photovoltaics in Buildings, a Design Handbook for Architects and Engineers", "Fraunhofer Institute for Solar Energy Systems ISE" pp. 143-144.
Strong, et al. "The Solar Electric House, A Design Manual for Home-Scale Photovoltaic Power Systems", Rodale Press 1987, pp. 225-234.
Joel Davidson, The New Solar Electric Home the Photovoltaics How-To-Handbook, 1987, aatec publications, pp. 138-152.

(56) References Cited

OTHER PUBLICATIONS

"Photovoltaics for Pumping Water, The Art & Science of Energy Remodeling Comparing Passive Water Heaters Wind Energy's Tough Dreamers", Solor Age, 1984, pp.

Emile, et al. "Brevet D'Invention", Ministère de la Production Endustrielle et du Travail.

"Report of Novelty Search," by Patentec, dated May 23, 2005.

Aubert, B. "Autonomous Photovoltaic Supply (20 k Wp) of The Kaw Mountain Relay Transmitter Center", Photovoltaic Demonstration Projects, Commission of the European Communities, 1991, pp, 347-353.

Chadjivassiliadis, J., et al. "Antikythira Solar Photovoltaic Power Plant", Photovoltaic Demonstration Projects, Commission of the European Communities, 1991, pp, 127-135.

"Electrification Explotacion Ganadera", Comercial Cointra, S.A. pp. 149, 157, 163.

Iliceto, et al. "Solar Energy Electrification of Isolated Dwellings Located at Ginostra (Stromboli Island)", Photovoltaic Demonstration Projects, Commission of the European Communities, 1991, pp, 190-197.

"PV Array Racks", Solar Age, Feb. 1984, pp. 64.

Russell, M. "An Apprentice's Guide to Photovoltaics", Solar Age, 1981, pp. 32-36.

"Today's Outstanding Photovoltaic Projects", Solar Age, Jun. 1985, pp-40-45.

Wolfe, M. "A Sunpowered Dream House" Solar Age, Dec. 1983, pp. 17-20.

\* cited by examiner

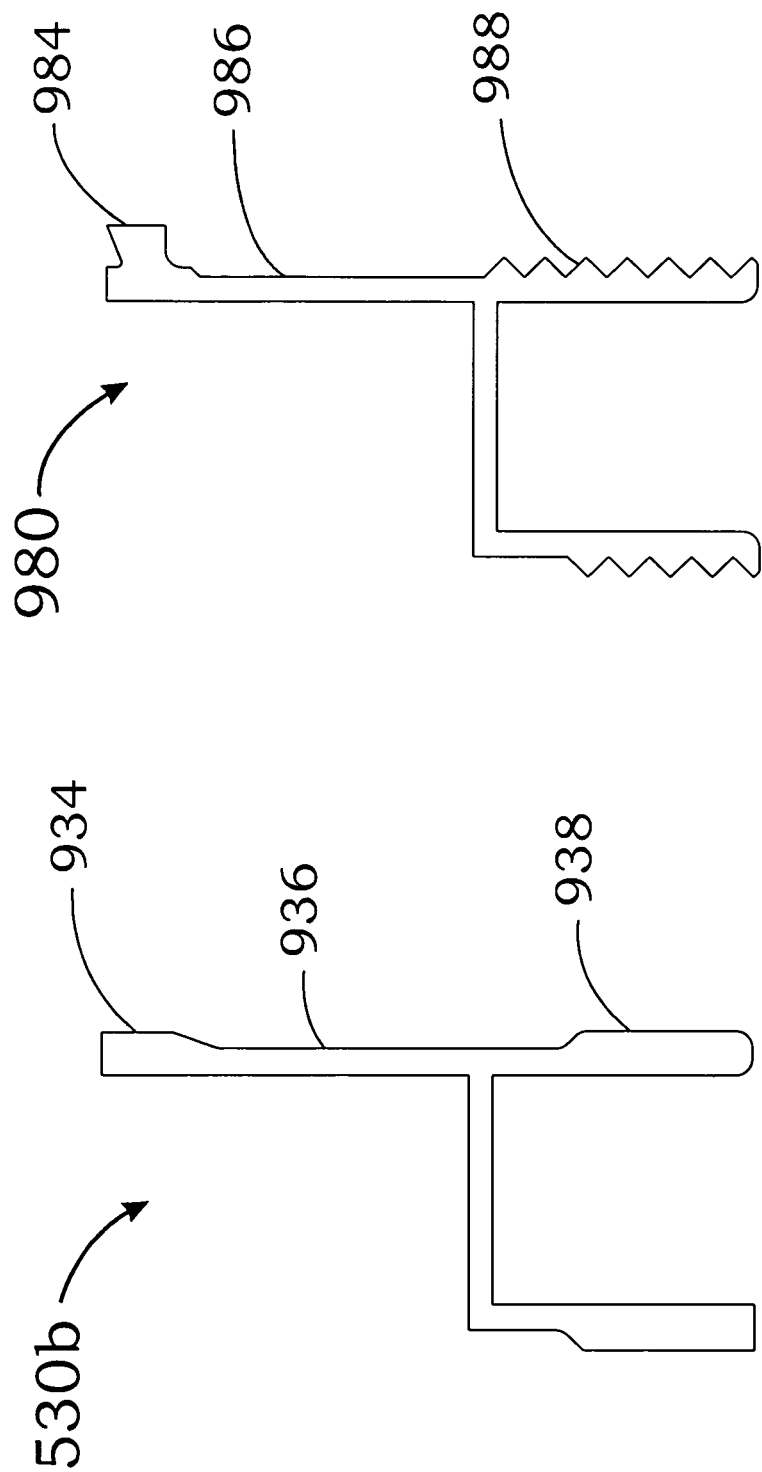

SOLAR ARRAY INTEGRATION SYSTEM AND METHODS THEREFOR

BACKGROUND OF THE INVENTION

The present invention relates to mounting systems. More particularly, the present invention relates to systems and methods for mounting solar energy capture systems to an outdoor surface.

Solar energy capture systems, such as photovoltaic (PV) arrays, can be used to convert solar energy into electricity. For ease of manufacturing and assembly, these solar energy capture systems typically include framed modular solar panels. While the processes of solar-based electrical generation and conversion have undergone many innovative changes, the techniques for mounting the solar panels have not been as well understood or studied.

In most installations, the solar panels are mounted in a "tilted" configuration in order to capture more solar radiation, i.e., the solar panels are better aligned with the solar angle of incidence. In mounting these tilted solar panels, the cause and effect of loads on the mounting surface must be understood and resolved, and these loads include standing loads and variable loads, also commonly called dead loads and live loads, respectively.

Standing loads are the result of the combined weight of the solar panels and the mounting system. These standing loads are predictable and hence easier to accommodate for during the installation of solar panels and mounting system.

Variable loads on tilted solar panels are mainly caused by environmental conditions, such as wind, rain, snow, hail, etc. Other potential environmental hazards include seismic events, temperature extremes, debris, and mold. In order to be able to reliably predict and accommodate variable loads, these environmental problems have to be understood and resolved, the most common and problematic being wind-induced forces (including hurricanes and tornadoes), namely lift and drag forces generated by the wind conditions. A variety of mounting systems which are commercially available for mounting solar panels attempt to address the wind-induced forces. Most of these mounting systems can be divided into several general categories: non-tilted solar panels, enclosed tilted solar panels, and tilted solar panels with wind deflectors attached to every row.

U.S. Pat. No. 5,746,839 (Dinwoodie) and U.S. Pat. No. 6,570,084 (Dinwoodie), are examples of implementations involving non-tilted solar panels. While non-tilted solar panels do present a lower profile with respect to the wind forces, they are less efficient at converting solar energy to electrical energy when installed at locations with higher latitudes. Another disadvantage of a non-tilted system is the accumulation of dirt, dust, debris and snow on top of the solar panels which can further reduce the conversion efficiency of these solar panels.

Moulder et al., U.S. Patent application 2004/0128923, discloses an example of an enclosed tilted solar panel system. While such a design offers advantages such as improved rigidity, less debris accumulation, and better protection of electrical components, an enclosed solar panel system unnecessarily increases the cost and weight of the system, is likely to increase wind-induced drag forces and also significantly reduces beneficial cooling from natural airflow.

In U.S. Pat. No. 6,063,996 (Takada), U.S. Pat. No. 6,809,251 (Dinwoodie) and U.S. Application 2004/0250491 (Diaz et al.), deflectors are installed on the north-facing back of every panel in order to reduce the wind-induced uplift forces, when installed in the northern hemisphere. Disadvantages of such systems include significantly increased cost and weight of the installed system. In addition, reduced cooling of the solar panels can also significantly reduce the solar conversion efficiency of the system.

In sum, the solar panel mounting systems described above all have significant disadvantages such as increased cost, increased weight, increased drag and propensity for reduced energy conversion efficiency. Hence there is a need for an improved system for mounting solar panels that is superior to these approaches while mitigating these drawbacks.

SUMMARY OF THE INVENTION

To achieve the foregoing and in accordance with the present invention, a solar array integration system (AIS) and methods for mounting solar energy capture devices are provided. Such systems are useful for applications such as mounting photovoltaic (PV) modules to a suitable surface such as a rooftop.

In one embodiment, the AIS includes a first row of tilted solar modules, a center spoiler coupled to the first row of tilted solar modules, the center spoiler is configured to deflect frontal airflow over the first row of tilted solar modules, and a second row of tilted solar modules, the second row of tilted solar modules being coupled to each other by an aerodynamic spar. The aerodynamic spar includes a deflector configured to deflect frontal airflow over the second row of tilted solar modules. The deflector may include a wedge-shaped profile. In some embodiments, the first row of solar modules is higher than the second row of solar modules.

AIS can also include a third row of tilted solar modules, with an end spoiler coupled to the third row of tilted solar modules, and wherein the end spoiler is configured to deflect side airflow over the third row of tilted solar modules. Baffles can be added to one or more subsequent rows of solar modules to deflect side airflow away from the bottom of the subsequent rows.

Note that the various features of the present invention described above can be practiced alone or in combination. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 9A and 9B are cross-sectional views of two embodiments of an aerodynamic upper spar for the solar panel assembly of FIG. 5B.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention. The features and advantages of the present invention may be better understood with reference to the drawings and discussions that follow.

To facilitate discussion, FIGS. 1 through 7C show various views and installation stages of a solar array integration system (AIS) 100 of the present invention. FIGS. 8A through 8E illustrate how the various components of AIS 100 contribute to improving wind resistance. FIG. 8F shows alternate embodiments of the spoilers of the present invention. FIGS. 9A and 9B are cross-sectional views of two exemplary embodiments of an aerodynamic spar for supporting a solar panel assembly, in accordance with the present invention.

AIS 100 can be installed to a suitable substantially flat outdoor surface such as a building rooftop or on the ground. In addition, "solar panel" and "solar module" are used interchangeably to describe a modular solar energy capture device, such as a photovoltaic (PV) module. PV modules are typically manufactured with aluminum frames which provide protection to the PV cells, structural integrity and mounting capability. In the following discussion of the present invention, AIS 100 is described in the context of a northern hemispheric installation with the solar panels tilted toward the south.

Assembly of the Solar Array Integration System (AIS)

Figure 1:
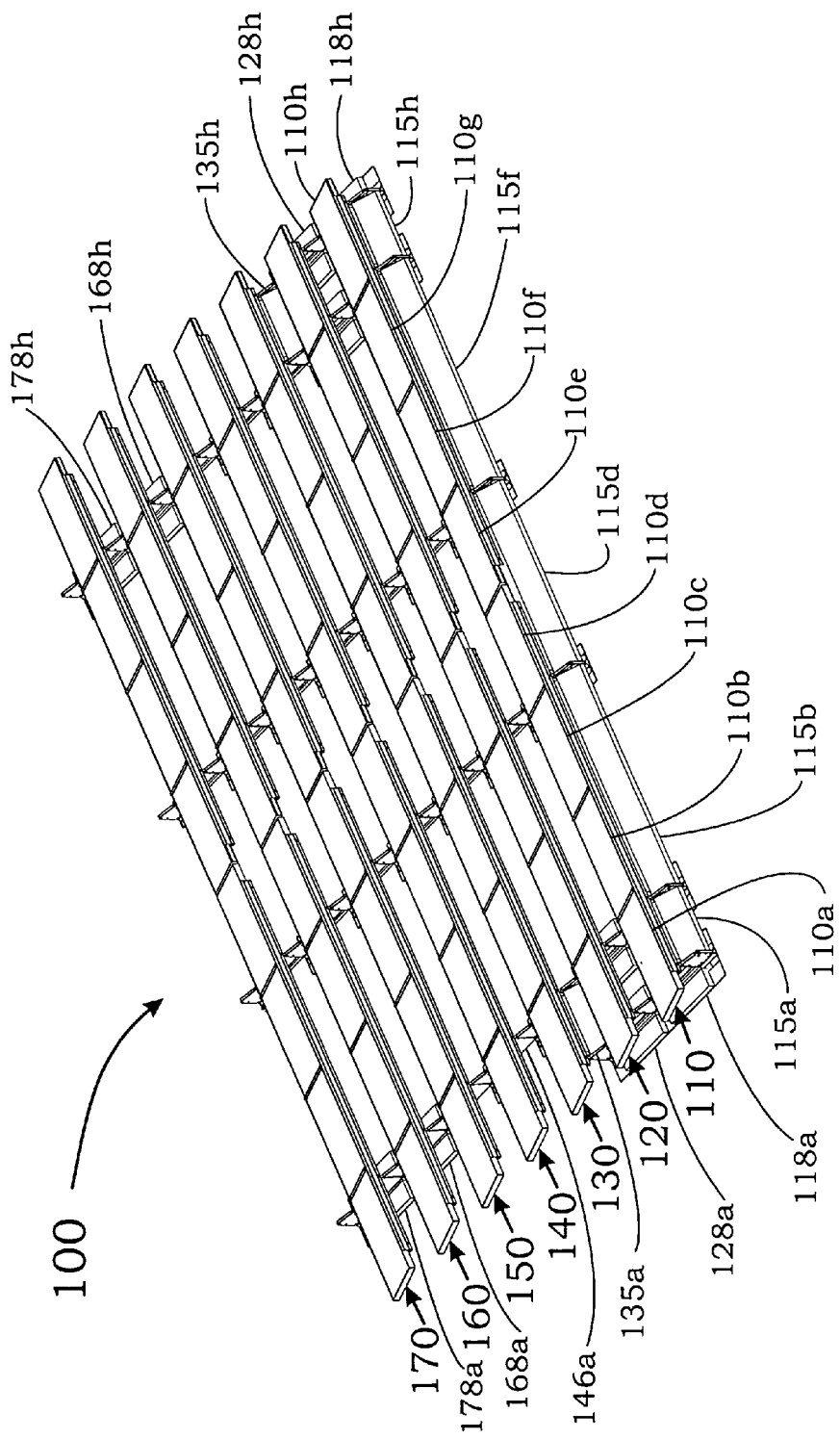
FIG. 1 is an isometric view of one embodiment of the solar array integration system (AIS) in accordance with the present invention.

Referring to FIG. 1, one embodiment of a solar array integration system (AIS) 100 of the present invention comprises solar module rows 110, 120, 130, 140, 150, 160, 170, together with end spoilers 115a, 115h, 135a, 135h, center spoilers 115b, 115f, span spoiler 115d, and ballasts 118a, 118h, 128a, 128h, 168a, 168h, 178a, 178h. There are several methods for installing AIS 100 onto a suitable substantially-flat surface, including a self-ballasting system, a ballasted system, a bonded system using a suitable adhesive, and a bolted system which penetrates the underlying surface.

Figure 2:
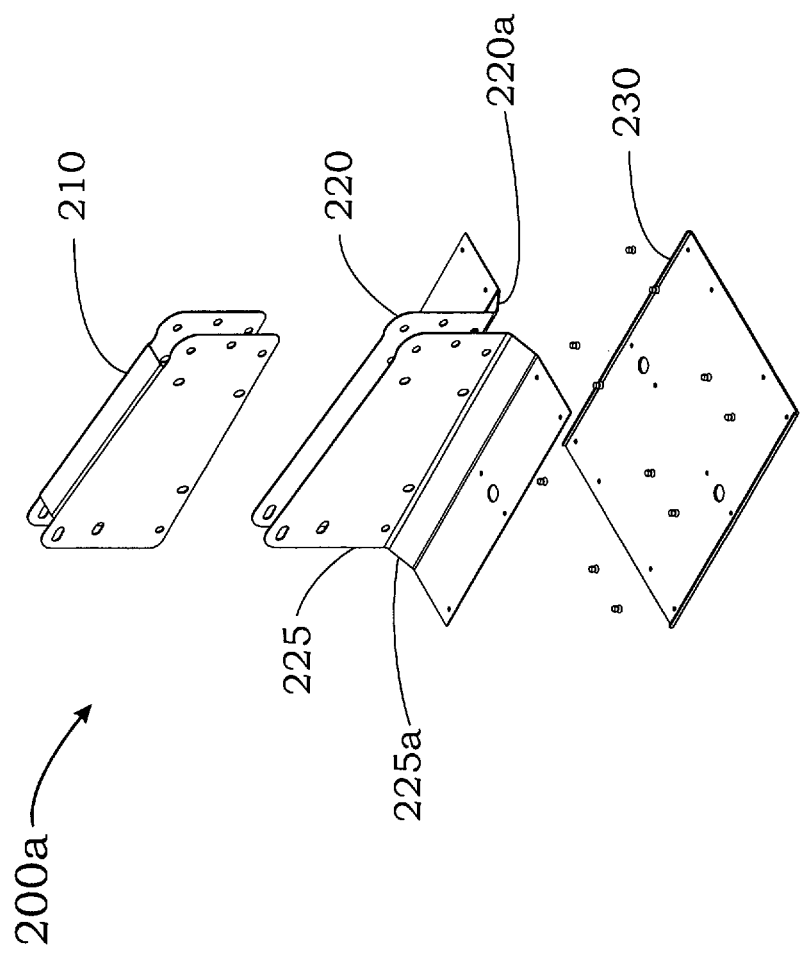
FIG. 2 illustrates the assembly of an exemplary tilt bracket used for supporting the AIS of FIG. 1.

FIG. 2 shows the components for a tilt bracket assembly 200a which includes a top plate 210, side plates 220, 225, and a base plate 230. Side plates 220, 225 are attached to opposite sides of top plate 210. The side plates 220, 225 are also attached to base plate 230 by suitable fasteners such as screws or rivets. It is also possible to weld the components together to form tilt bracket 200a. Other embodiments of tilt bracket 200a are also possible. For example, tilt bracket 200a can be formed from one piece of sheet metal instead of several pieces of sheet metal.

In some ballasted embodiments as illustrated by rows 110, 120 of FIG. 1, a larger common base plate extends across and is shared by two adjacent tilt brackets, with the common base plate being coupled to one or more ballasts, e.g., ballasts 118a, 128a. It is also possible to individually ballast each appropriate tilt bracket. Suitable ballasts include pre-cast concrete pavers or stair treads, typically about three feet long, one feet wide and two inches thick. Concrete stair treads are commercially available from home building suppliers such as Home Depot or Lowes.

Figure 3:
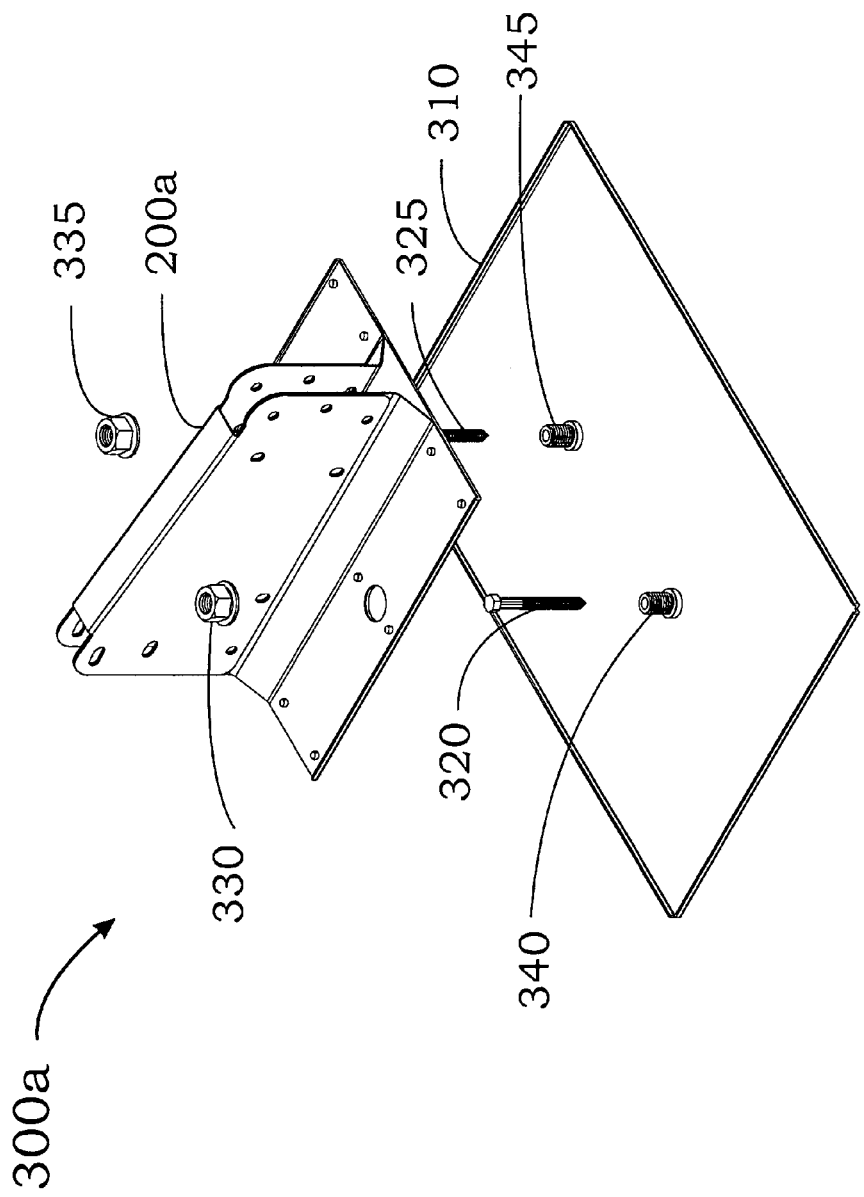
FIG. 3 shows the tilt bracket of FIG. 2 coupled to an anchor plate allowing tilt bracket to be bolted to the underlying surface while forming a secure weather-tight seal.

In some bolted embodiments as illustrated in FIG. 3, tilt bracket 300a can be mounted to an optional anchor plate 310 by raised threaded protrusions 340, 345 and nuts 330, 335 to form a mountable tilt bracket 300a. Anchor plate 310 can be connected to the underlying surface with lag screws 320, 325 through raised threaded protrusions 340, 345 which also enable a weather-tight seal to be formed between the bottom surface of anchor plate 310 and the underlying surface.

Figure 4:
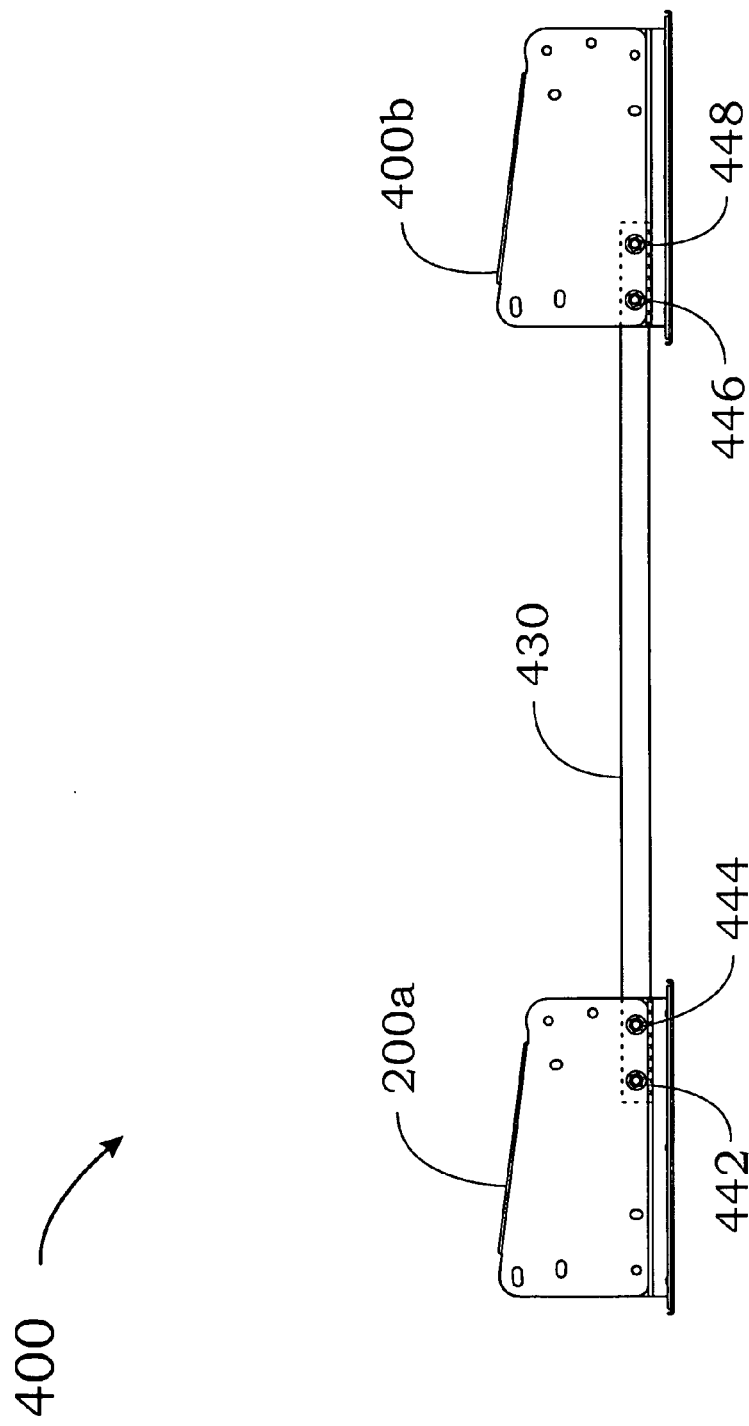
FIG. 4 show how the tilt bracket of FIG. 3 can be linked to an adjacent tilt bracket.

In FIG. 4, tilt bracket 200a is coupled to an adjacent tilt bracket 400b by a link 430 and secured by bolts 442, 444, and bolts 446, 448, respectively, thereby forming a pair of linked tilt brackets 400 as part of two adjacent rows of linked tilt brackets for supporting one row of solar panels. This process of adding adjacent rows of linked tilt brackets can be repeated to support additional rows of solar panels. For example, a third tilt bracket (not shown) can be linked to the left of tilt bracket 200a by another identical link (not shown).

Figure 5A:
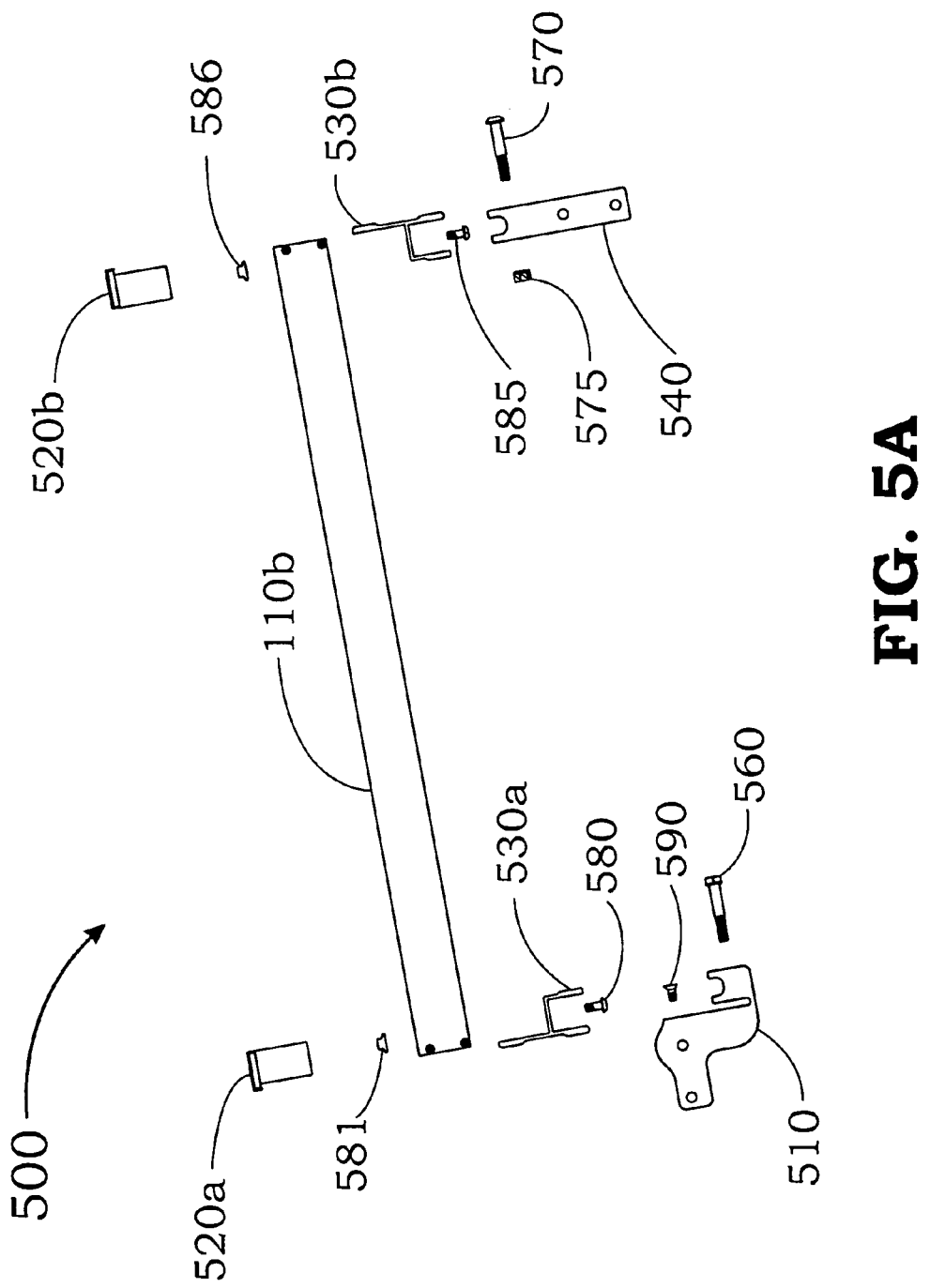
FIGS. 5A and 5B show the construction of a solar panel assembly in preparation for mounting to the tilt brackets of FIG. 4.
Figure 5B:
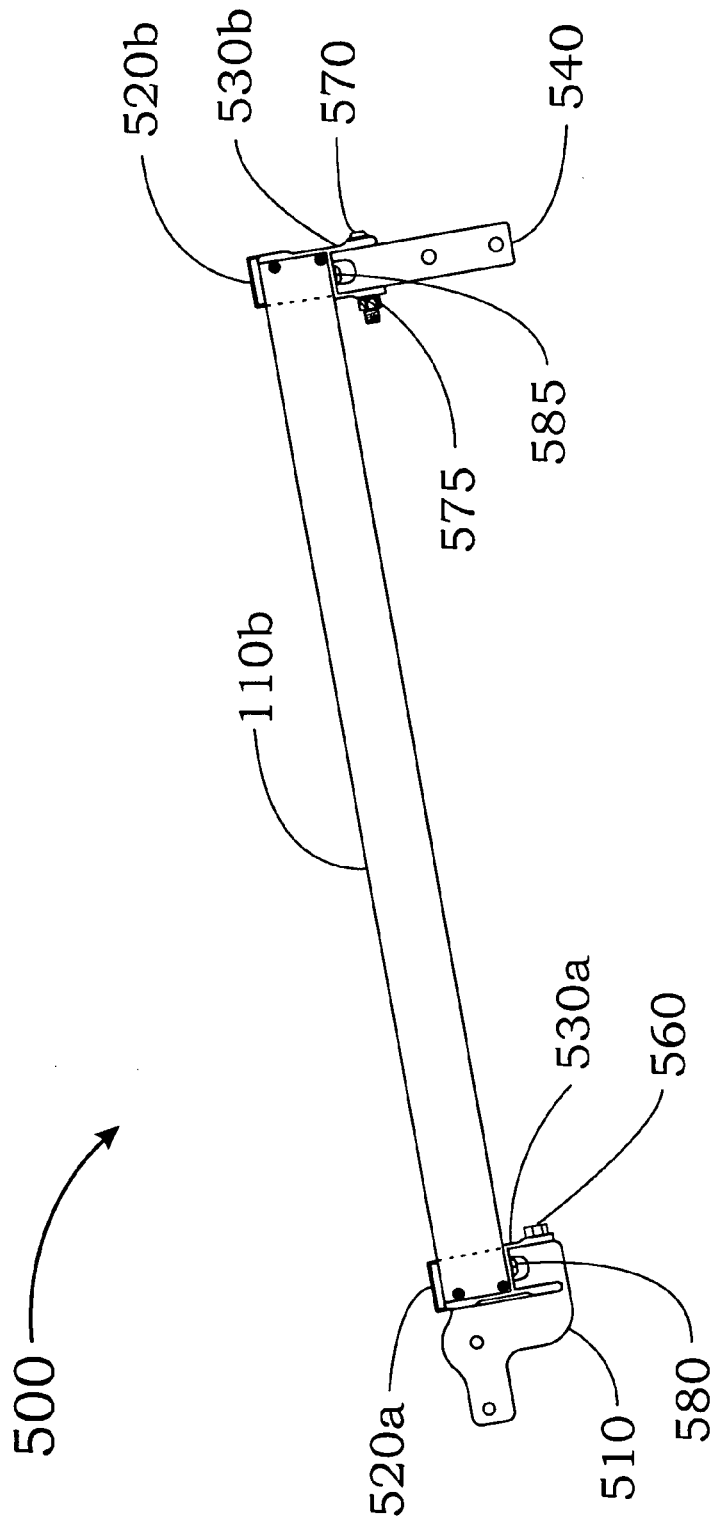

FIG. 5A shows a PV module 110b, a pair of spacer blocks 520a, 520b, a lower spar 530a, an upper spar 530b, a pivot block 510, and an anchor block 540 as separate components prior to assembly. In FIG. 5B, a solar panel assembly 500 is formed by coupling PV module 110b to the support components shown in FIG. 5A. Module 110b is coupled to lower spar 530a by screw 580, nut plate 581, and coupled to upper spar 530b by screw 585 and nut plate 586. Lower spar 530a is coupled to pivot block 510 by screw 590 (hidden) and bolt 560, while upper spar 530b is coupled to anchor block 540 by bolt 570 and nut 575.

Referring also to FIG. 1, one or more PV modules, typically four PV modules, e.g., modules 110a, 110b, 110c and 110d are assembled together with a pair of spars, e.g., lower spar 530a and upper spar 530b, and three pairs of spacer blocks. Spacer blocks provide two important functions, maintaining a proper gap between the PV modules and to better secure the PV modules to the spars. It is also possible to substitute each pair of spacer blocks, e.g., blocks 520a, 520b, with a single spacer bar which spans the corresponding lower and upper spars, e.g., lower spar 530a and upper spar 530b. This exemplary four-module assembly is then attached to a pair of pivot blocks and a pair of anchor blocks, with each pivot and anchor block attached to a corresponding one of four tilt brackets.

Figure 6A:
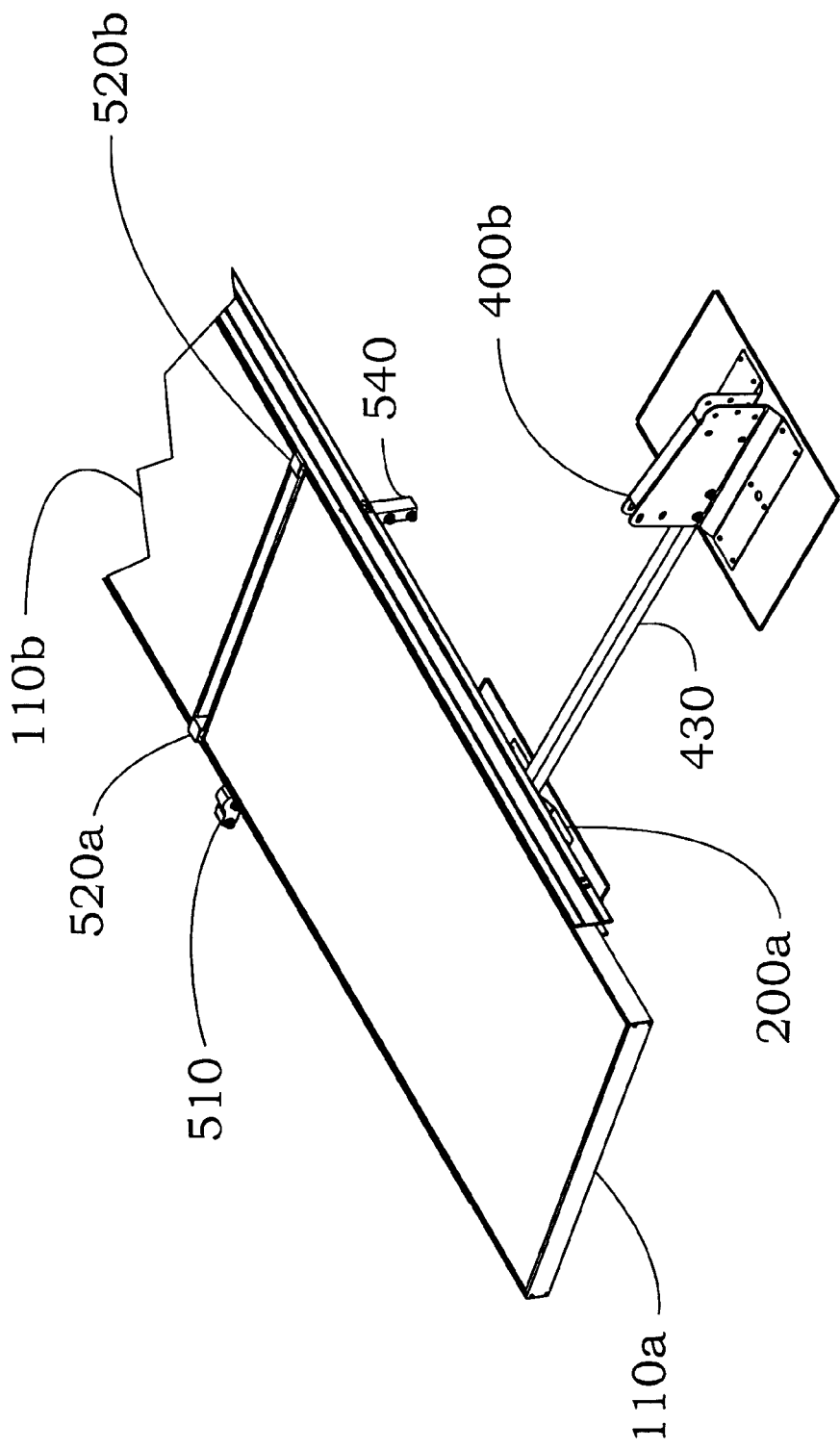
FIGS. 6A and 6B illustrate how the solar panel assembly of FIG. 5B is attached to the tilt brackets of FIG. 4.
Figure 6B:
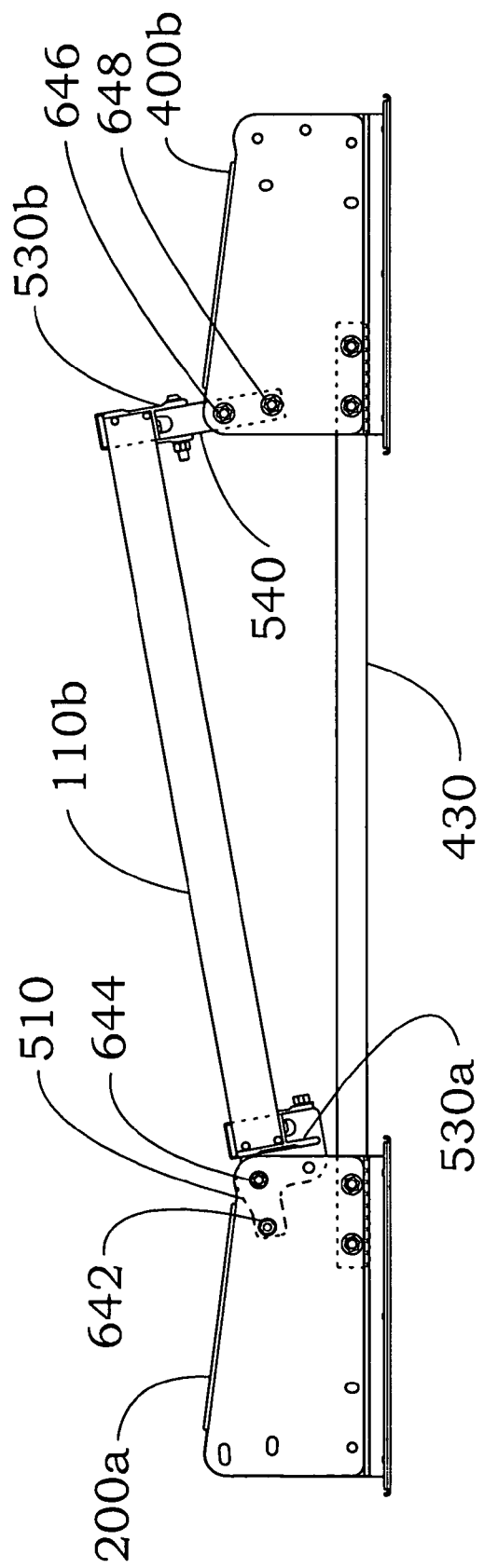

FIG. 6A is an isometric view showing the solar panel assembly 500 of FIG. 5B prior to assembly with linked tilt brackets 200a, 400b. FIG. 6B illustrates how solar panel assembly 500 is coupled to the pair of linked tilt brackets 400 of FIG. 4. Bolts 642, 644 secure pivot block 510 to tilt bracket 200a, while bolts 646, 648 secure anchor block 540 to tilt bracket 400b.

Figure 7A:
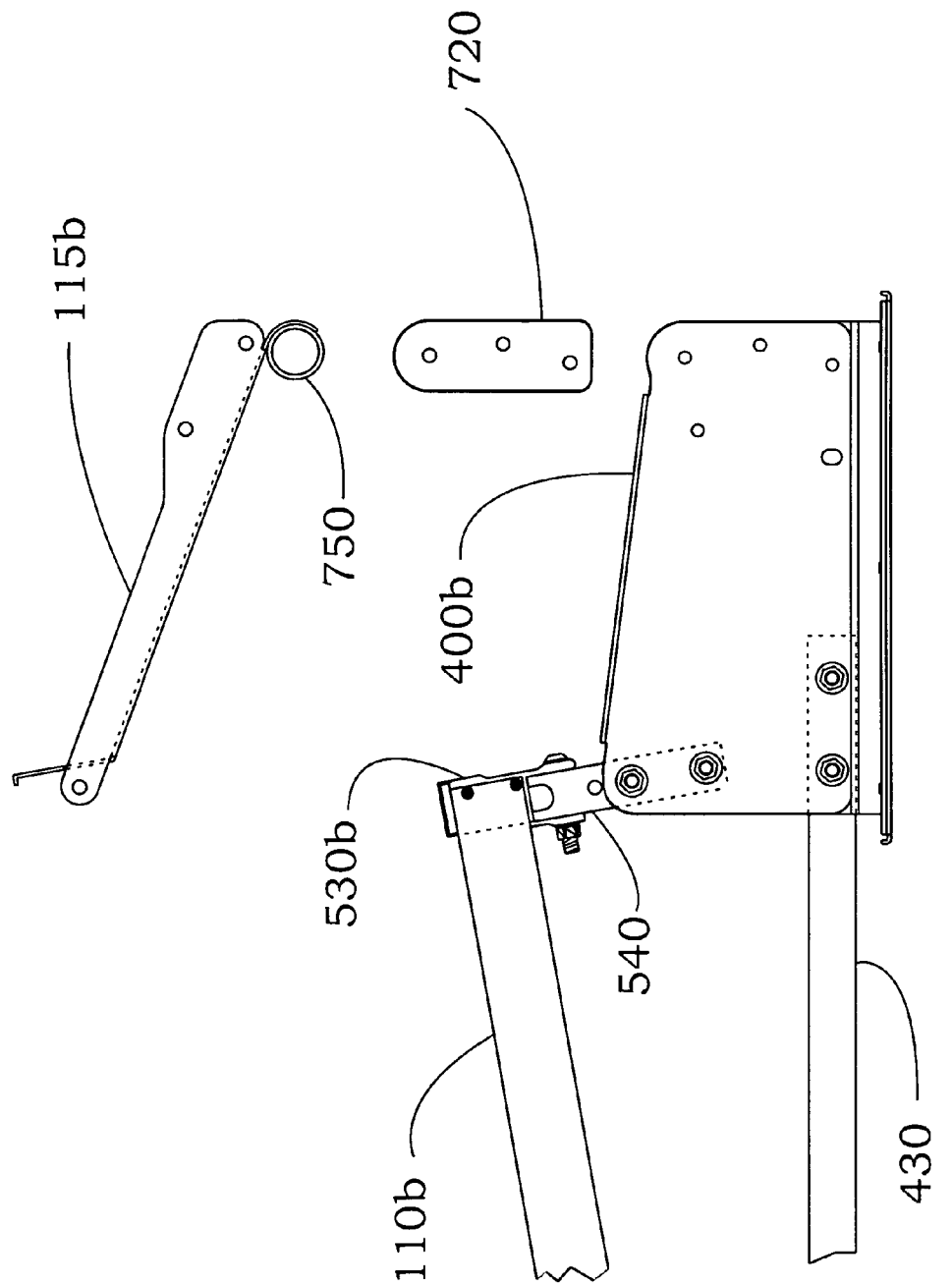
FIGS. 7A-7C illustrate how a spoiler is attached to the mounted solar panel assembly of FIG. 6B.
Figure 7B:
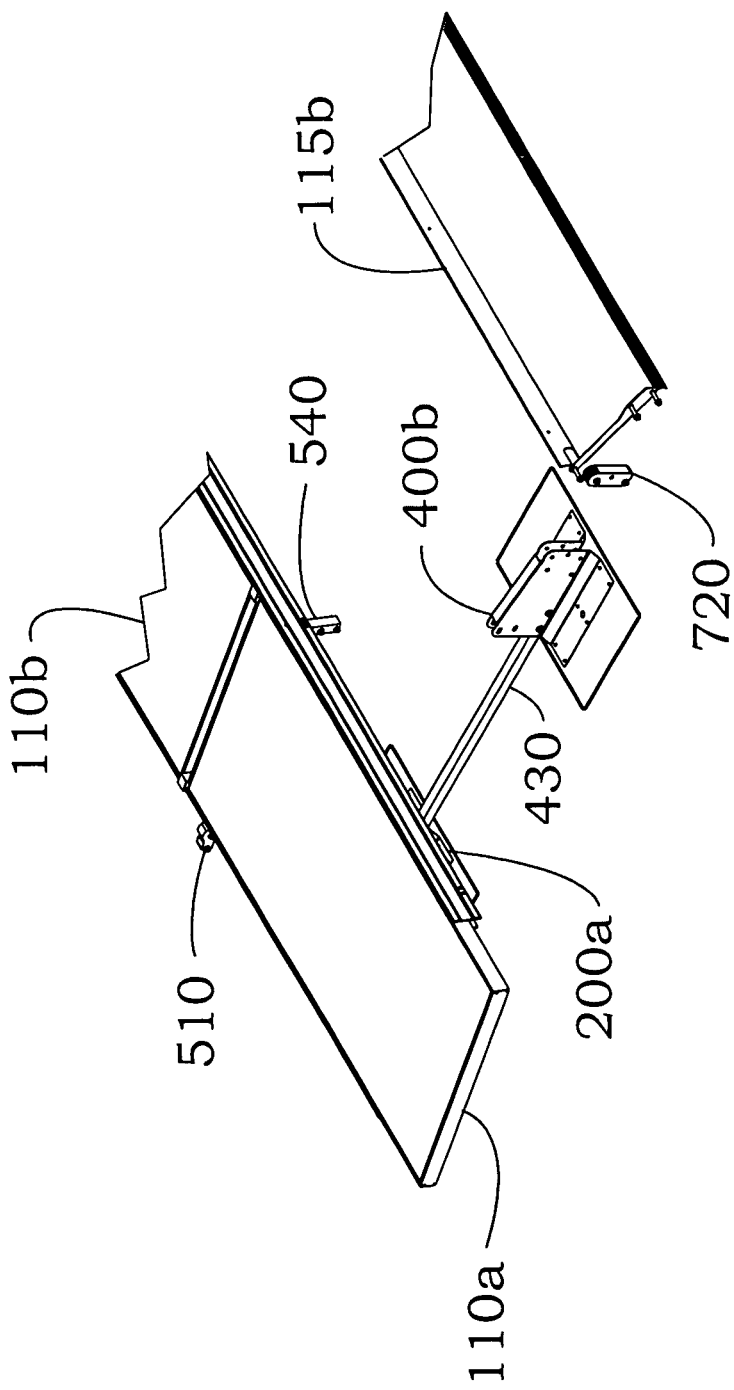

Referring now to FIG. 7A, spoiler 115b is ready to be attached to tilt bracket 400b together with a support block 720. FIG. 7B is an isometric view which shows solar panel assembly 500, spoiler 115b and support block 720 prior to assembly with tilt bracket 400b.

Figure 7C:
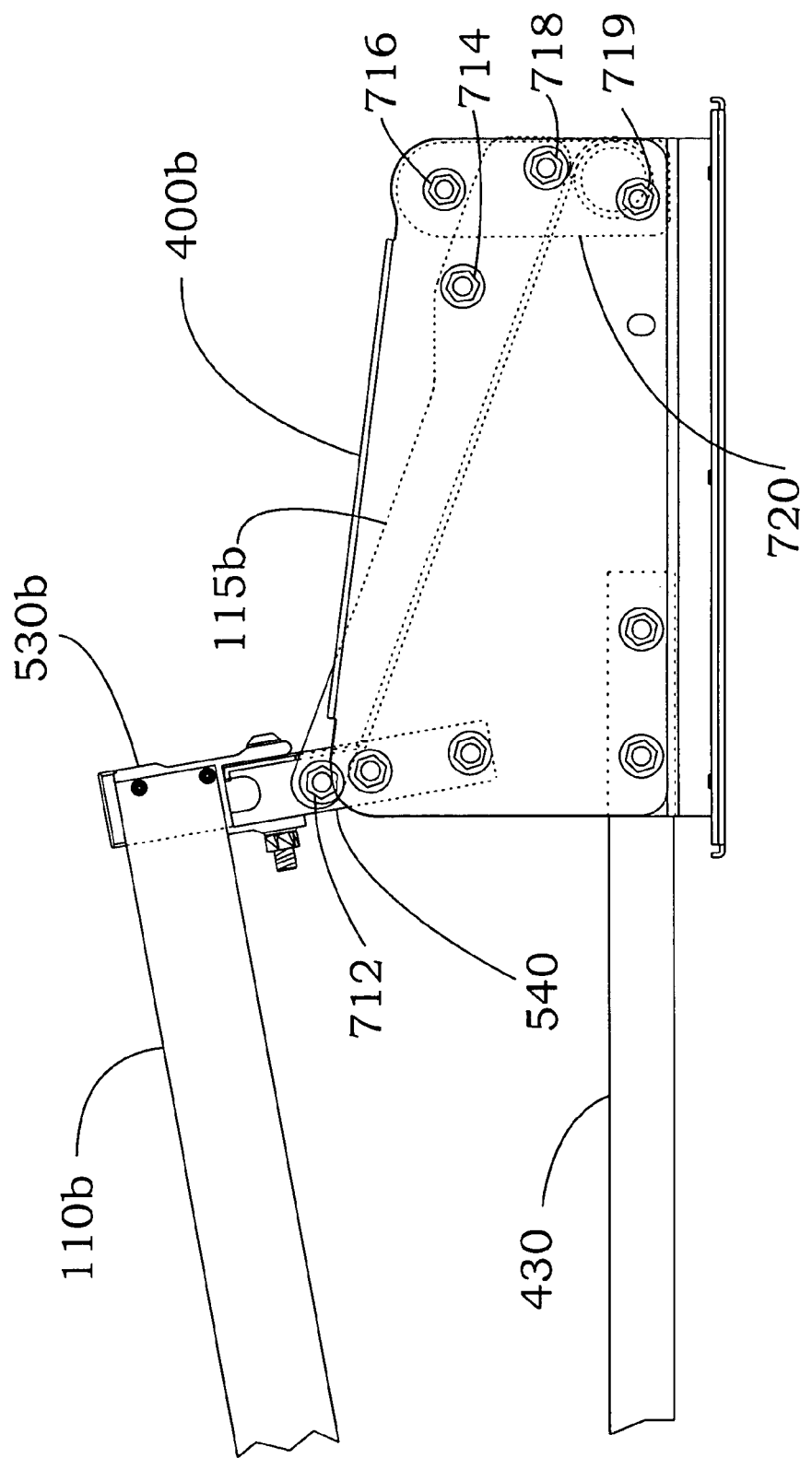

FIG. 7C shows spoiler 115b attached to anchor block 540 by bolt 712, and attached to tilt bracket 400b by bolts 714, 718. FIG. 7C also shows support block 720 attached to tilt bracket 400b by bolts 716, 718, 719. Block 720 also functions as a north-end block for the northern-most tilt bracket. Note that the upper horizontal edge of spoiler 115b fits snugly under a lower channel of upper spar 530b, and can be secured with screws or bolts.

In one embodiment as illustrated by FIG. 1, spoiler 115b extends horizontally from one tilt bracket to the next tilt bracket, which is approximately the length of two PV modules, for example, spoiler 115b extends across PV modules 110b and 110c. In some embodiments, the rigidity of spoiler 115b can be reinforced by the addition a hollow tubular section 750 under the lower horizontal edge of spoiler 115b as shown in FIG. 7A.

Enhancing the Structural Integrity and Utility of AIS

As discussed above, the combination of modular lightweight AIS components all contribute to the enhancement of the structural integrity of AIS 100 while minimizing the standing loads on the underlying mounting surface, typically a suitable substantially-level surface such as the roof of a building or an otherwise unused open space such as a covered parking garage.

Tilt bracket bases adjust AIS weight distributions and interface to the underlying surface. Tilt bracket bases provide seismic resistant mechanical anchoring as well as the field application of adhesives for increased seismic resistance as shown in FIG. 3. Tilt brackets allow for easy attachment of spoilers. Tilt brackets can also incorporate features to enable electrical conduit mounting or routing and to enable attachment or mounting of electrical junction boxes. Depending on the implementation, tilt brackets can provide even distribution of AIS weight on the underlying surface, and in rooftop applications, transfer AIS weight closer to load bearing elements of the supporting building.

As discussed above, tilt brackets are coupled to each other by longitudinal links, e.g., tilt brackets 200a, 400b are coupled together by link 430. Using links to interconnect tilt brackets, and incorporating oversized holes, e.g. slotted or elongated holes, in either the tilt brackets or links or both (see FIG. 7A), advantageously allows AIS 100 to conform to imperfections of the underlying surface without introducing stress. As a result, there is a more balanced distribution of the AIS weight on the underlying surface, typically a rooftop.

As shown in FIGS. 2 and 3, tilt brackets can also include slotted holes for the attaching anchor blocks to enhance the AIS ability to conform to imperfections of the underlying surface. In addition, side plates 225, 220 can include angular bends 225a, 220a, respectively, to further increase the conformity of AIS 100 to the underlying surface. Other advantages of using links include flexibility in the number of solar panel rows needed for a specific implementation, and modularity of component parts which reduces stocking space and costs.

Referring to FIGS. 1, 5A, 5B and 6B, spacer blocks, e.g., blocks 520a, 520b, ensures accurate mounting of PV modules, e.g., modules 110a, 110b, in relation to the multi-function spars, to create the panel sub-assembly. Spacer blocks control module-to-module span-wise positioning while also clamping the modules to the spars. Spacer blocks also enhance the rigidity and the moment resistance of the joints between PV modules. Nut plates work with spacer blocks to provide proper spacing and attachment of PV modules along the spar in order to form multi-module assemblies. Nut plates, e.g., nut plates 581, 586, also add stiffness and strength to the module-spar mechanical connections.

In one embodiment, the building block of AIS 100 is a solar panel assembly (as defined in IEEE 928) comprising four PV modules, e.g., module 110a, 110b, 110c, 110d, that are fastened to lower and upper spars 530a, 530b. IEEE 928 a Standard published by the Institute of Electrical and Electronics Engineer, titled "Recommended Criteria for Terrestrial Photovoltaic Power Systems" available from the IEEE Standards Association at website http://standards.ieee.org.

Depending on the specific installation needs, spars may be continuous—of single-piece construction—or multi-piece over the span of the spar. The spars of these four-module assemblies can also be coupled to each other by longitudinal links thereby forming larger assemblies. In some embodiments, spars may incorporate a cooling circuit channel, enabling module heat removal and thereby further increase photovoltaic generator efficiency.

To enable best use of available space of the underlying surface, two or more PV module assemblies are possible, e.g., for use in locations that are proximate to roof-mounted equipment or to roof penetrations. Certain AIS interface components can be shared by successive rows. The isometric drawing of FIG. 8D depicts one such array that consists of three rows 110, 120, 130, each containing four modules for a total of twelve (12) PV modules, corresponding electrically to, for instance, a 24 VDC electrical string (see NEC Article 690). Besides providing structural support for PV modules, AIS components, e.g., the spars, also provides an electrical grounding path (see NEC Article 690). NEC Article 690 is an National Electrical Code Standard which available from IEEE's website http://standards.ieee.org.

Referring to FIG. 6B, pivot blocks enable the raising and lowering of row sections to facilitate the installation and maintenance of AIS 100, by for example removing bolts 642, 646, 648 and temporarily reinstalling bolt 642, thereby securing row 110 in the "raised" position. Together with anchor blocks and tilt brackets, pivot blocks establish the geometry that controls the relation of PV modules, e.g., module 110a, to the solar angle of incidence. Pivot and anchor blocks may incorporate indexing features that allow for manual or automatic seasonal tilt adjustment. To save AIS cost and weight, truncated pivot and anchor block variants, south-end blocks and north-end blocks, respectively, can are used for southern-most and northern-most rows.

Hence, the use of AIS corrosion-resistant modular components of the present invention advantageously provides structural integrity with minimal standing loads, rapid installation, ease of maintenance, modifications and/or removal if required.

Improving Resistance to Wind-Induced Forces

In accordance with the solar array integration system (AIS) 100 of the present invention, the combination of the AIS components, including spoilers, aerodynamic spars, spacing between solar panels, and layout of the AIS rows all contribute to improving wind resistance. Resistance to wind is substantially increased by the use of these AIS components which are designed to reduce aerodynamic lift and drag resulting from wind-induced forces. In a typical installation, which can be a substantially flat rooftop of a suitable building, wind resistance can be further increased by controlling the placement and alignment of the components of AIS 100 within the available space on the rooftop.

Wind resistance of AIS 100 can be improved by controlling the placement, alignment and dimensions of the AIS components, including the ratio of row separation to row height over the roof surface, in combination with deployment of flow dispersive and momentum sinking aerodynamic enhancements within the array and on the array perimeter of AIS 100. This AIS arrangement induces displacement of wind flow over rather than through AIS 100.

Figure 8A:
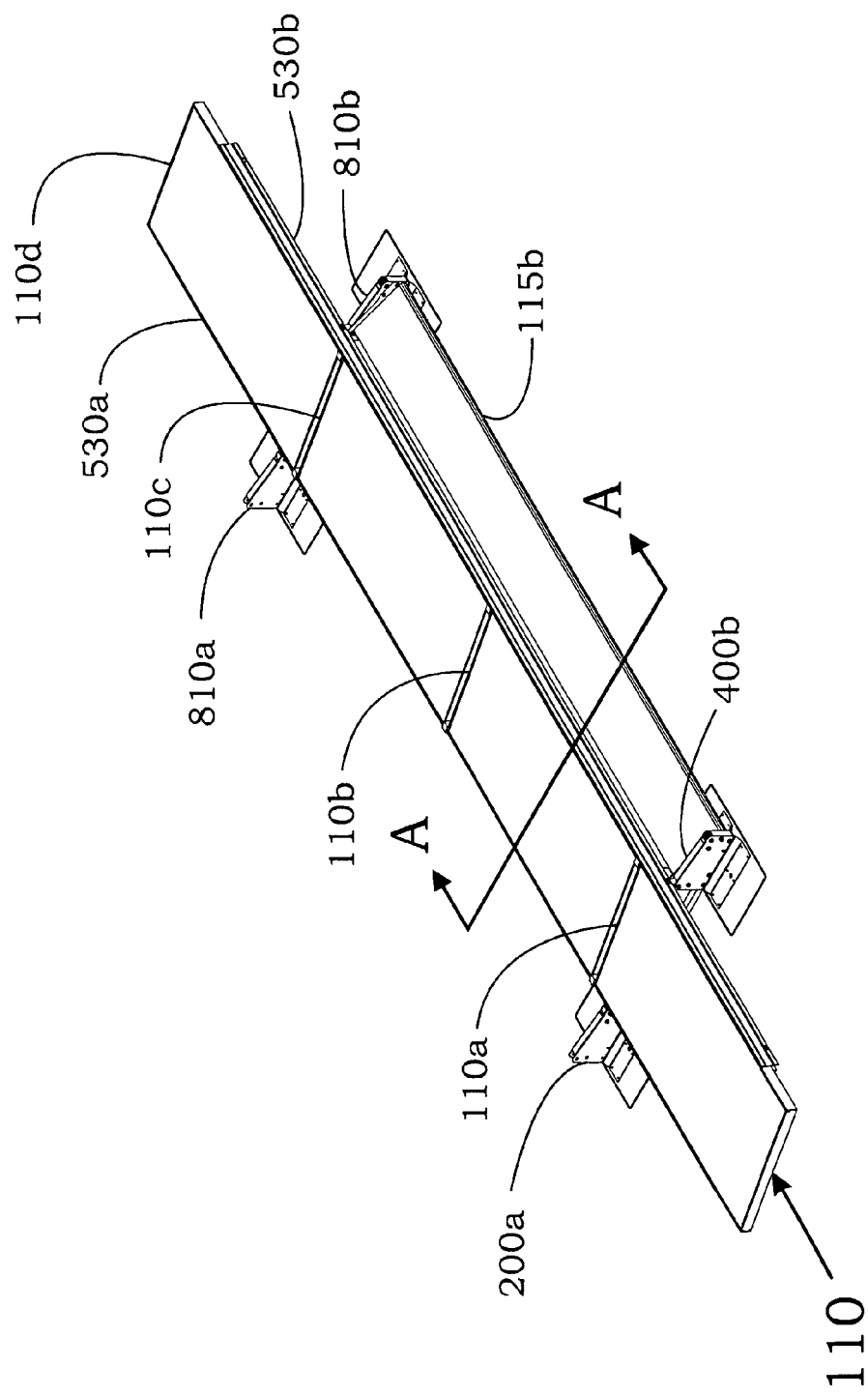
FIG. 8A is an isometric view of a first row of mounted solar panels of the AIS together with a center spoiler.
Figure 8B:
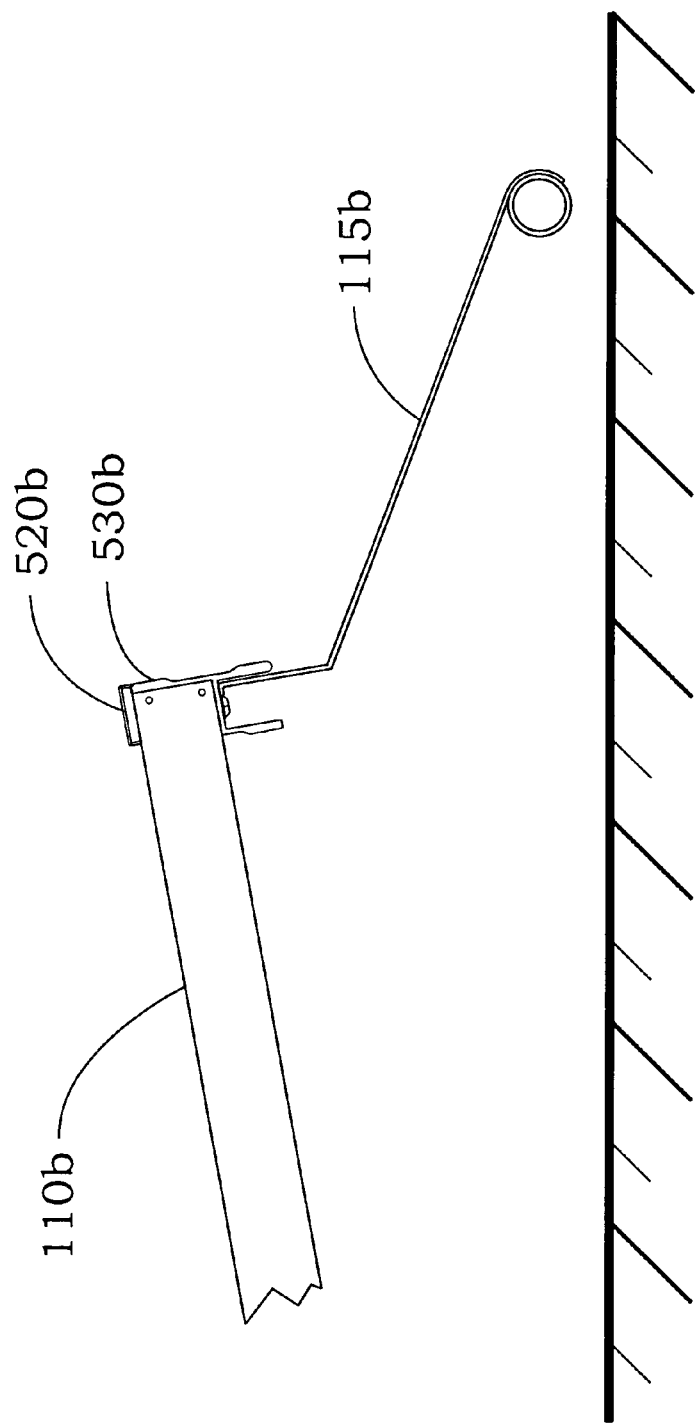
FIG. 8B is an A-A cross-sectional view of FIG. 8A.

FIG. 8A is an isometric view showing the first row of solar panels 110 of AIS 100 which includes PV modules 110a, 110b, 110c, 110d, and showing spoiler 115b. Modules 110a, 110b, 110c, 110d are coupled together by lower spar 530a (partially hidden) which is attached to tilt brackets 200a, 810a. Modules 110a, 110b, 110c, 110d are also coupled together by upper spar 530b which is attached to tilt brackets 400b, 810b. As discussed above, the upper edge of spoiler 115b is located snugly in a channel of the upper spar 530b. The left and right folds of spoiler 115b are attached to tilt brackets 400b, 810b, respectively. FIG. 8B is an A-A cross-sectional view of FIG. 8A, showing PV module 110b, upper spar 530b and spoiler 115b.

In some embodiments, portions of tilt bracket walls and base incorporate a plurality of V-shaped grooves in the along-wind (north-south) direction to dissipate turbulence and to reduce drag.

Shock-absorbing wind snubbers (not shown) can be added to AIS 100 attenuate and damp the effects of both sustained wind loading and occasional higher energy gusts. Wind snubbers can be used in lieu of or in conjunction with spacer blocks and have the effect of damped torsional springs fastened between span-oriented modules.

Figure 8C:
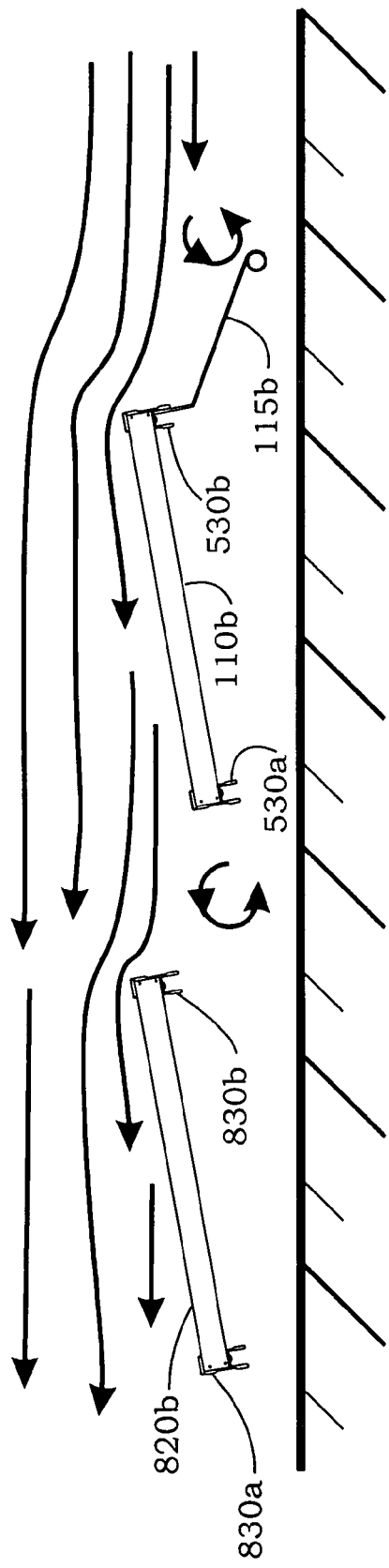
FIG. 8C illustrates the effect the spoiler and first two rows of the AIS have on wind flowing from right to left.
Figure 8D:
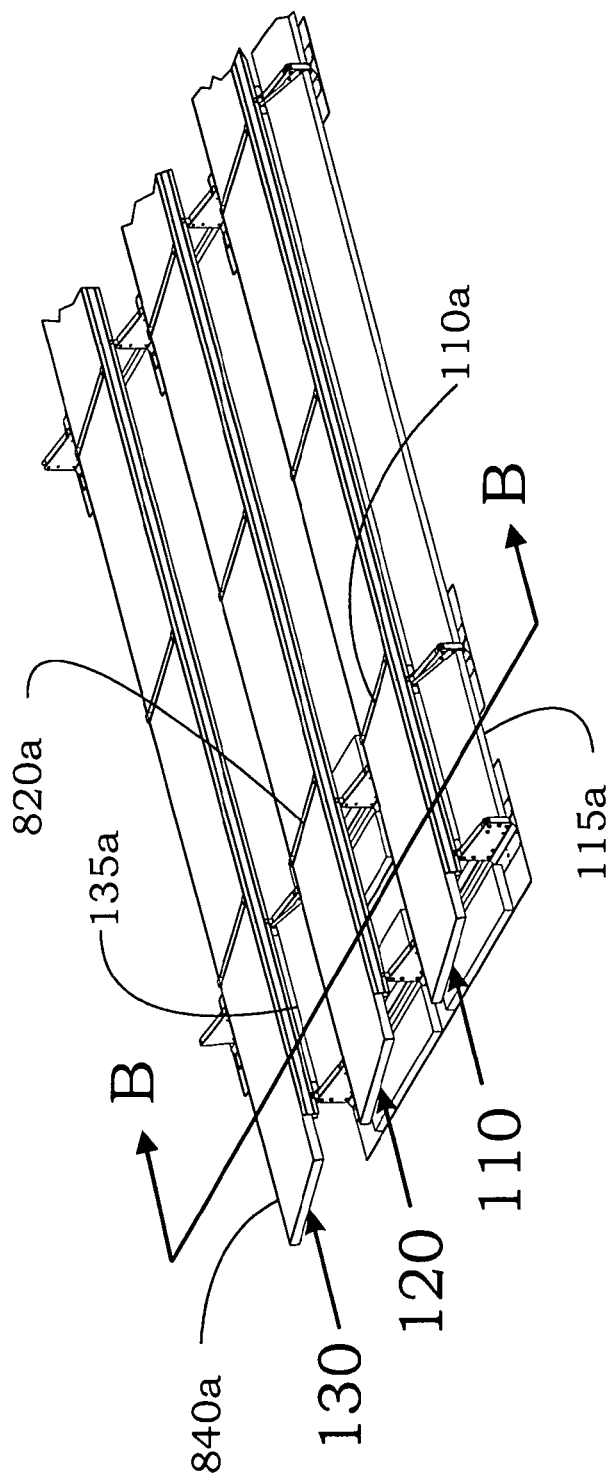
FIG. 8D is an isometric view of three rows of mounted solar panels of the AIS together with a couple of end spoilers.

FIG. 8C is a cross-sectional view of the first two rows 110, 120 of AIS 100, comprising PV module 820b supported by spars 830a, 830b, PV module 110b supported by spars 530a, 530b, and spoiler 115b. The arrows illustrate the effect of PV modules 820b, 110b, upper spars 830b, 530b and spoiler 115b have on wind traveling from right to left.

The contour of spoiler 115b is a tradeoff between minimizing the lift, drag, and surface area (cost and weight). For example, allowing some airflow underneath the tubular lower edge of spoiler 115b close to the underlying surface may be beneficial in minimizing drag without substantially increasing lift.

The combination of spoiler 115b coupled to the first row 110 and upper spar 830b coupled to second row 120 prevents the reattachment of the air flow (from the wind), and results in the formation of a dissipating vortex in front of PV module 820b. As shown in FIG. 1, this arrangement of upper spars can be repeated in subsequent rows resulting in a flow dissipating volume encompassing self-aligning space frame assembly matrix for AIS 100.

In one embodiment, for the northern-most row of PV modules, row 110, the row length to row height ratio should preferably not be less than 25:1. The AIS row separation, e.g., between rows 110 and 120, to row height ratio should preferably be set to not less than 1:1. Row separation is the gap between the front of a row and the back of the next row. In addition, the height of row 110 should be equal to or higher than the height of the other rows in AIS 100, after accounting for the effect of roof crown and pitch relative to a given array or if applicable, in respect to the entire array field.

Referring to FIGS. 1 and 8A-8D, the one-module deep perimeter of AIS 100 is configured to displace flow and to sink wind momentum by the following arrangement. For example, in row 110, rigid spoilers 115a, 115b, 115d are coupled to upper spar 530b, and rigid spoilers 115d, 115f, 115h are coupled to an adjacent upper spar. The spoilers of row 110, including spoilers 115a, 115b, 115d, 115f, 115h, are set to an angle α below the horizontal plane substantially equal to the module tilt angle setting α above the horizontal plane. Spoilers 115a, 115b, 115d, 115f, 115h blocks (sin α·L) or more of the vertical height over ground and preferably over 85% of the horizontal extent of row 110 where L equals the distance across the tilted module faces of the PV modules, e.g., module 110b. Rigid spoilers 115a, 115b, 115d, 115f, 115h can be fabricated from either solid or staggered pattern perforated aluminum or stainless steel sheet, and preferably with about 40% open area. As a result of these features, AIS 100 is resistant to wind displacement without the need for roof-penetrating anchors or the use of external ballast elements.

In some embodiments, for the northern-most row of AIS 100, i.e., row 110, thin cross-section flexible spoilers are affixed to the upper spars and set to an angle α below the horizontal plane equal to the module tilt angle α setting above the horizontal plane. These flexible spoilers block (sin α·L) or more of the vertical height over ground and preferable over 85% of the horizontal extent of the row. The flexible spoilers can be fabricated from thin aluminum or stainless steel sheet with a section thickness selected to deform in the along-wind direction under the design wind load with the effect thereby of sinking momentum while reducing form drag.

Figure 8E:
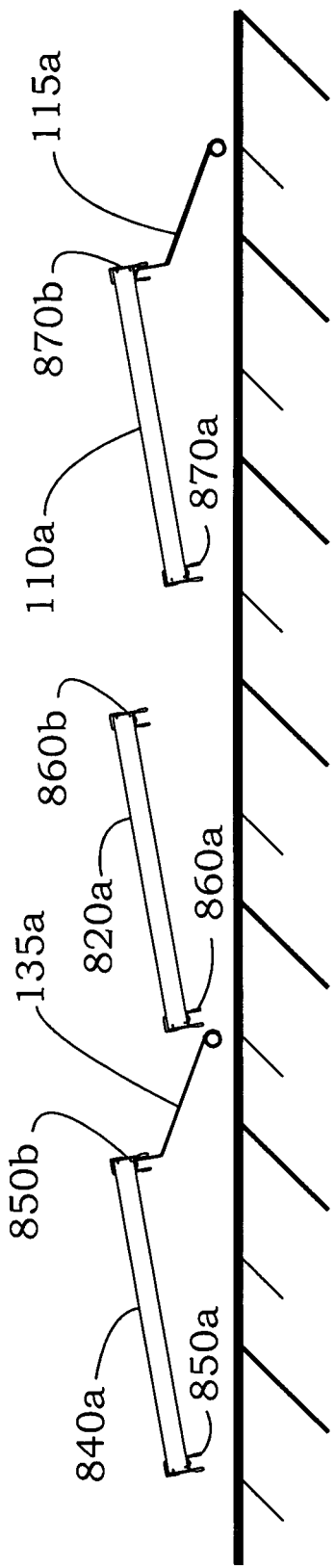
FIG. 8E is a B-B cross-sectional view of FIG. 8D.
Figure 8F:
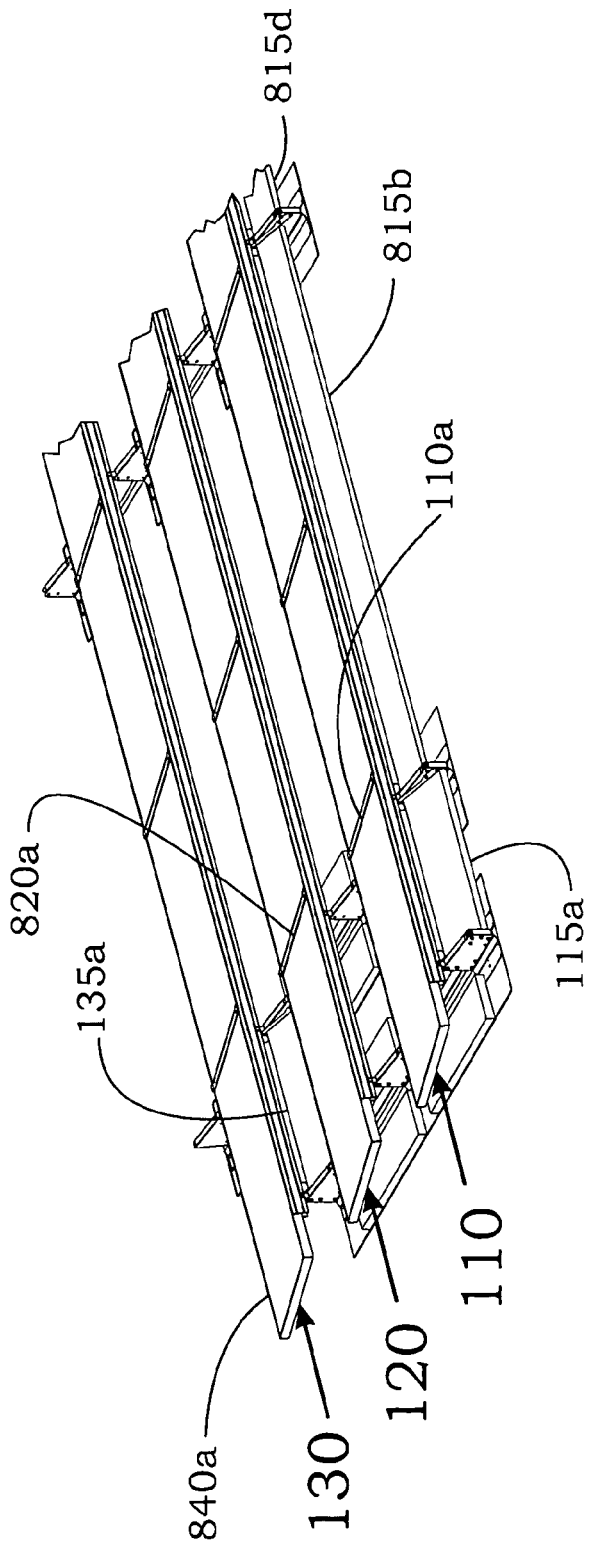
FIG. 8F show alternate embodiments of center and span spoilers of the present invention.

Referring now to FIG. 8D, three rows of solar panels 110, 120, 130 are shown with end spoilers 115a, 135a. FIG. 8E is a cross-sectional view B-B of FIG. 8D, showing PV module 840a supported by spars 850a, 850b, PV module 820a supported by spars 860a, 860b, PV module 110a supported by 870a, 870b, and end spoilers 115a and 135a.

Referring to both FIGS. 1 and 8D, end spoilers 115a, 115h function as a part of an integral spoiler assembly comprising of adjacent spoilers 115a, 115b, 115d, 115f and 115h. End spoilers 135a, 135h function to improve side wind resistance by deflecting side winds along the respective north-south edges of AIS 100.

In some embodiments as shown in FIG. 1, for all or part of the north-south extension of AIS 100 on the eastern and/or western perimeter edge, vertical wind baffles, e.g., baffle 146a, under the eastern edge of row 140, are affixed between successive tilt brackets utilizing bolting common to adjacent components. Each baffle is sized to block approximately 80% or more of the substantially triangular open vertical area underneath the module and between the pair of tilt brackets and interconnecting link. Rigid baffles can be manufactured from staggered pattern perforated aluminum or stainless steel sheet with about 40% open area. Alternatively, flexible wind baffles can be manufactured from thin aluminum or stainless steel sheet with section selected to deform in the across-wind direction under the design wind load with the effect thereby of sinking momentum while reducing form drag.

FIG. 8F is an isometric view showing alternate embodiments of center spoiler 815b and span spoiler 815d which are narrower than spoilers 115b, 115d of FIG. 8D. The narrower spoilers 815b, 815d are useful in installations where the wind forces are not expected to be as strong and/or when the weight or cost of AIS 100 is of greater concern.

As discussed above and illustrated the embodiment of FIG. 1, AIS 100 has a low distributed weight and an adjustable roof contact "patch" to control bearing loads. The AIS perimeter weight can be varied by for example adding ballasts 118a, 128a, 168a, 178a, 118h, 128h, 168h, 178h according to physical setting in order to absorb air parcel momentum under wind loading.

Referring to FIG. 8C which shows wind flow around AIS 100, and FIG. 9A which illustrates the wind resistance reducing cross-sectional profile of one embodiment of upper spar 530b which includes a front deflector having a recessed section 936 between two raised sections 934, 938. In this embodiment, the depth of front deflector of upper spar 530*b*, i.e., the combined width of sections 934, 936, 938, is approximately four inches.

In accordance with the present invention, spar 530*b* incorporates an integral flow-reattachment-prevention front deflector providing for continuous row-wise flow separation, countering the natural tendency toward flow reattachment thereby assuring continuous displacement, i.e., deflection, of the design air parcel to the volume above AIS 100. In doing so, vortexes are induced between PV module rows 110, 120, 130.

For example, as illustrated by Table A below, at latitudes up to about 40 degree north, AIS 100 can be installed using solar modules which are about thirty-nine inches (39″) wide and two inches thick. Row spacing is measured from the front of one row to the front of the next row. Row height is measured from the top of the PV module to the underlying surface, e.g., the surface of the roof.

TABLE A

| Tilt Angle | 5 degrees | 10 degrees | 15 degrees | 20 degrees |
| --- | --- | --- | --- | --- |
| Row Spacing | 48″ | 55″ | 61″ | 66″ |
| Height | 10″ | 13″ | 17″ | 20″ |

In another example, as illustrated by Table B below, AIS 100 can be installed at locations with latitude up to about 40 degree north, using solar modules which are about thirty-one inches wide and two inches thick.

TABLE B

| Tilt Angle | 5 degrees | 10 degrees | 15 degrees | 20 degrees |
| --- | --- | --- | --- | --- |
| Row Spacing | 38″ | 43″ | 48″ | 52″ |
| Height | 9″ | 12″ | 15″ | 18″ |

Spars, e.g., spar 530*b*, can be sized to length to create a cantilevered assembly of PV modules supported for load transfer near the quarter-points resulting in a structurally efficient assembly with a highly predictable response to aerodynamic loads. Spars incorporate features that enable attachment of fixed or flexible aerodynamic wind spoilers. Spars are provided in a structurally efficient form that enables transfer of wind loads (minimized by the AIS system architecture) through a load path utilizing moment connections to the rotator and tilt blocks that are in turn moment connected to the highly compliant tilt brackets.

FIG. 9B is a cross-sectional view showing another embodiment of spar 980 with a dovetail section 984, a recessed section 986 and a washboard section 988.

The wedge shape of dovetail section 984 provides a complex edge into the air flow stream and shaves off the portion of the air parcel that would otherwise have a tendency to slide down the low pressure side of the PV module, e.g., module 820*b*, and cause the module to lift. Instead, section 984 advantageously causes this portion of the air parcel to spin off into the vortex between module 820*b* and module 110*b* described above.

In the free stream airflow zone directly above AIS 100, both accelerated shear flow and turbulent kinetic energy are present. The flow-reattachment-prevention front deflector of spar 530*b* takes the form of a continuous anti-lift angled wedge that extends windward from the spar and into the free stream boundary. In this position, the anti-lift wedge has the effect of disrupting the flow stream and preventing flow attachment to any row thereby preventing consequent suctioning uplift force on the top surfaces of the modules. Accordingly, the wedge shape profile effectively increases the airflow deflecting capability of the front deflector for a given spar deflector depth.

In addition, the ribbed surface washboard section 988 induces shear stress in the air space between the vortex and the structure of module thereby reducing air coherence and driving the vortex scale down to a level at which the vortex energy can be dissipated as heat.

Many modifications of AIS 100 are possible within the scope of the present invention. For example, while the embodiment of AIS 100 described above is in a landscape orientation, other array configurations are possible, portrait orientation. Variable tilt angles and/or motorized tile brackets are also possible. It is also possible to incorporate the aerodynamic spar features directly into the frame of the solar modules.

Although a 10 degree (10°) tilt angle is used to describe one embodiment, other tilt angles are also possible. Accordingly, PV modules of AIS 100 can be at a pre-determined tilt angle from the horizontal (preferably from 5° to 20°) for orientation to the southern sky in the northern hemisphere (northern sky in the southern hemisphere). The tilt angular range is a tradeoff between wind resistance, solar gain (efficiency of energy conversion) and the capability for self-draining during rain or rinse-off, cooling etc, trapping of debris underneath the array and ease of debris removal. It is also possible to combine different tilt angles for different rows of AIS 100. For example, northern-most row 110 may be tilted at 15 degrees, while rows 120, 130, 140, 150, 160, 170 may be at tilted at 10 degrees.

While AIS 100 is described using one embodiment floating on friction pads, it is also possible to attach AIS 100 to the mounting surface using suitable fasteners such as bolts, or using a suitable adhesive. Alternatively, floating AIS 100 can be anchored to one or more ballast, or tethered to secure attachment points with cables and/or chains. Perimeter blocks can also be provided for additional containment of AIS 100.

The present invention can also be practiced with other techniques for reducing wind resistance. For example, it is possible to add wind deflectors around the edges of the building rooftop. In addition, "solar panel" includes a variety of modular solar energy capture and conversion devices, suitable for converting solar energy into electrical energy (as in the above described embodiment) or other forms of energy, such as heat energy.

While this invention has been described in terms of several preferred embodiments, there are alterations, modifications, permutations, and substitute equivalents, which fall within the scope of this invention. Although sub-section titles have been provided to aid in the description of the invention, these titles are merely illustrative and are not intended to limit the scope of the present invention.

It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention.

What is claimed is:

1. A solar array system for mounting at least one solar module onto a mounting surface, the system comprising:
   at least one solar module;
   a first tilt bracket;
   a second tilt bracket;

wherein the first and second tilt bracket each comprise a first and second side plate and a base plate;
a pivot block attached to a first end of the solar module;
a connector connecting the first tilt bracket and the pivot block, wherein the connector comprises a shaft through the pivot block and the first and second side plates of the first tilt bracket, whereby the pivot block can rotate within the first tilt bracket; and
a longitudinal link connected between the first and second tilt brackets, wherein the longitudinal link is not connected to the solar module and is a separate component from a mounting surface;
wherein the pivot block pivots on the connector to allow the solar module to be raised and lowered.

2. The system of claim 1, further comprising:
an anchor block attached to a second end of the solar module and to the second tilt bracket.

3. The system of claim 2, further comprising:
a lower spar attached to the first end of the solar module; and
an upper spar attached to the second end of the solar module.

4. The system of claim 3, wherein the anchor block is adjustable to provide an optimum tilt angle of the solar module relative to a solar angle of incidence.

5. The system of claim 3, wherein the anchor block is adjustable to provide at least two fixed settings for seasonal adjustment of a tilt angle of the solar module.

6. The system of claim 3, wherein the pivot block and anchor block are indexed to provide an indication of predefined tilt adjustments.

7. The system of claim 3, wherein a plurality of solar modules are interconnected via a plurality of tilt brackets, pivot blocks and links.

8. The system of claim 3, wherein four solar modules are assembled together with upper and lower spars; and
the four modules and spars are attached to two pivot blocks and two anchor blocks, with each pivot block and each anchor block attached to a corresponding one of four tilt brackets.

9. The system of claim 7, further comprising:
at least one spacer block located between adjacent solar modules.

10. A solar module assembly for mounting at least two solar modules onto a mounting surface, the assembly comprising:
a sub-assembly comprising:
at least two solar modules;
a lower spar connecting a first end of each of the at least two solar modules; and
an upper spar connecting a second end of each of the at least two solar modules;
two pivot blocks attached to a first end of the sub-assembly;
two anchor blocks attached to a second end of the sub-assembly;
first, second, third and fourth tilt brackets, wherein each tilt bracket comprises a first and second side plate, and a base plate; and
a first longitudinal link connected between the first and the second tilt bracket, and a second longitudinal link connected between the third and the fourth tilt bracket, wherein the longitudinal links are not connected to the solar module and are separate components from a mounting surface;
wherein each pivot block connects to a separate tilt bracket via a connector, wherein the connector comprises a shaft through the pivot block and the first and second side plates of the tilt bracket, whereby the pivot block can rotate within the tilt bracket, and each anchor block connects to one tilt bracket, wherein each pivot block pivots on a connector to allow the sub-assembly to be raised and lowered as a unit.

11. The assembly of claim 10, wherein the sub-assembly comprises three solar modules.

12. The assembly of claim 10, wherein the sub-assembly comprises four solar modules.

13. The assembly of claim 10, wherein the solar modules in the sub-assembly can be raised and lowered as a group.

14. The assembly of claim 10, further comprising at least one spacer block between the at least two solar modules.

15. A solar array system for mounting at least one solar module onto a mounting surface, the system comprising:
at least one solar module;
a first tilt bracket;
a second tilt bracket;
wherein the first and second tilt bracket each comprise a first and second side plate and a base plate;
a pivot block means for connecting a first end of the solar module to the first tilt bracket side plates and for allowing the solar module to be raised and lowered without removing the solar panel from the first tilt bracket; and
a longitudinal link connected between the first and second tilt brackets, wherein the longitudinal link is not connected to the solar module and is a separate component from a mounting surface.

* * * * *